United States Patent [19]
Johnsgard et al.

[11] Patent Number: 6,046,439
[45] Date of Patent: *Apr. 4, 2000

[54] SYSTEM AND METHOD FOR THERMAL PROCESSING OF A SEMICONDUCTOR SUBSTRATE

[75] Inventors: Kristian E. Johnsgard; Brad S. Mattson, both of Los Gatos; James McDiarmid, Pleasanton; Vladimir J. Zeitlin, Santa Clara, all of Calif.

[73] Assignee: Mattson Technology, Inc., Fremont, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/876,788

[22] Filed: Jun. 16, 1997

Related U.S. Application Data

[60] Provisional application No. 60/019,804, Jun. 17, 1996.

[51] Int. Cl.$^7$ ...................................... H05B 3/68
[52] U.S. Cl. ........................ 219/444.1; 219/405; 219/390; 392/416; 432/120; 432/202
[58] Field of Search ...................... 432/202, 209, 432/5, 6, 11, 241, 120; 219/390, 405, 411, 444.1; 392/416, 418; 118/724, 725

[56] References Cited

U.S. PATENT DOCUMENTS

| | | | |
|---|---|---|---|
| 3,293,074 | 12/1966 | Nickl | 117/201 |
| 4,010,690 | 3/1977 | Cocozella et al. | 102/97 |

(List continued on next page.)

FOREIGN PATENT DOCUMENTS

| | | | |
|---|---|---|---|
| 0 134 716 A1 | 3/1985 | European Pat. Off. | C30B 31/12 |
| 0 612 862 A1 | 8/1994 | European Pat. Off. | C23C 16/52 |

(List continued on next page.)

OTHER PUBLICATIONS

D. Aitken et al., "A New VLSI Compatible Rapid Thermal Processing System," Nucl. Instrum. Meth. Phys. Res. B21, at 622–626 (1987).

R. T. Fulks et al., "Rapid isothermal annealing of ion implantation damage using a thermal radiation source," Appl. Phys. Lett. 39(8), Oct. 15, 1981, pp. 604–606.

Opaque Quartzglass Quartzglass OM–100, General Product Description, PCI–C 20–E, May 1994, Haraeus Quarzglas GmbH, Germany.

(List continued on next page.)

*Primary Examiner*—Denise L. Ferensic
*Assistant Examiner*—Jiping Lu
*Attorney, Agent, or Firm*—Wilson Sonsini Goodrich & Rosati

[57] ABSTRACT

A semiconductor substrate processing system and method using a stable heating source with a large thermal mass relative to conventional lamp heated systems. The system dimensions and processing parameters are selected to provide a substantial heat flux to the wafer while minimizing heat loss to the surrounding environment (particularly from the edges of the heat source and wafer). The heat source provides a wafer temperature uniformity profile that has a low variance across temperature ranges at low pressures. A resistively heated block is substantially enclosed within an insulated vacuum cavity used to heat the wafer. Insulating walls comprising a reflective material, such as polished tungsten, encapsulated within an inert insulating material, such as quartz, may be used to provide insulation. The isothermal nature of the processing region may be enhanced by using multiple layers of insulating walls, actively heated insulating walls or a conductive gas to enhance heat transfer to the semiconductor substrate. A semiconductor substrate may be heated and cooled in stages in the processing system to avoid slip. Proximity, conductive gases and cooling gases may be used to increase or decrease the level of heating in stages.

27 Claims, 8 Drawing Sheets

U.S. PATENT DOCUMENTS

| | | | |
|---|---|---|---|
| 4,555,273 | 11/1985 | Collins et al. | 148/1.5 |
| 4,641,603 | 2/1987 | Miyazaki et al. | 118/724 |
| 4,649,261 | 3/1987 | Sheets | 219/390 |
| 4,698,486 | 10/1987 | Sheets | 250/492.2 |
| 4,770,630 | 9/1988 | Akimoto et al. | 432/121 |
| 4,794,217 | 12/1988 | Quan et al. | 437/247 |
| 4,823,735 | 4/1989 | Pichel et al. | 118/730 |
| 4,857,689 | 8/1989 | Lee | 219/10.71 |
| 4,909,314 | 3/1990 | Lamont, Jr. | 165/80.3 |
| 4,914,276 | 4/1990 | Blair | 219/390 |
| 5,001,327 | 3/1991 | Hirasawa et al. | 219/390 |
| 5,011,794 | 4/1991 | Grim et al. | 437/247 |
| 5,060,354 | 10/1991 | Chizinsky | 29/25.02 |
| 5,062,386 | 11/1991 | Christensen | 118/725 |
| 5,119,761 | 6/1992 | Nakata | 118/725 |
| 5,252,131 | 10/1993 | Kiyama et al. | 118/725 |
| 5,252,807 | 10/1993 | Chizinsky | 219/390 |
| 5,429,498 | 7/1995 | Okase et al. | 432/152 |
| 5,430,271 | 7/1995 | Orgami et al. | 219/388 |
| 5,440,132 | 8/1995 | Joyner et al. | 250/492 |
| 5,462,603 | 10/1995 | Murakami | 118/719 |
| 5,651,827 | 7/1997 | Aoyama et al. | 118/725 |
| 5,660,472 | 8/1997 | Peuse et al. | 374/128 |
| 5,680,502 | 10/1997 | Kim | 392/416 |
| 5,695,564 | 12/1997 | Imahashi | 118/719 |
| 5,830,277 | 11/1998 | Johnsgard et al. | 118/725 |

FOREIGN PATENT DOCUMENTS

| | | | |
|---|---|---|---|
| 0 718 610 A1 | 6/1996 | European Pat. Off. | G01J 5/00 |
| 61-139024 | 6/1986 | Japan | H01L 21/205 |
| 62-120475 | 6/1987 | Japan | C23C 16/44 |
| 2-238616 | 9/1990 | Japan | H01L 21/027 |
| 4-61117 | 2/1992 | Japan | H01L 21/205 |
| 7-335582 | 12/1995 | Japan | H01L 21/22 |

OTHER PUBLICATIONS

L. Peters, "The Hottest Topic in RTP," Semiconductor International, Aug. 1991, pp. 56–62.

F. Roozeboom, "Manufacturing Equipment Issues in Rapid Thermal Processing," Rapid Thermal Processing Science and Technology, Academic Press, pp. 349–423.

Table 1:

Estimated Wafer Temperature
without Gas Conduction

- With quartz shield (emissivity = 0.5)
- Wafer emissivity = 0.7
- Temperature Susceptor = 1127C
- Equilibrium Wafer Temperature in Celsius
- 1-dimensional calculations

- Light Grey: Twafer < 1050C  @equilibrium
- Dark Grey: Twafer < 950C  @equilibrium

| $\epsilon_{susceptor}$ => $\epsilon_{wall}$ | 0.1 | 0.2 | 0.3 | 0.5 | 0.7 | 0.9 | 1.0 |
|---|---|---|---|---|---|---|---|
| 0.1 | 956 | 1033 | 1062 | 1088 | 1099 | 1105 | 1107 |
| 0.2 | 889 | 986 | 1028 | 1065 | 1081 | 1090 | 1093 |
| 0.3 | 853 | 959 | 1006 | 1049 | 1069 | 1080 | 1084 |
| 0.5 | 814 | 927 | 980 | 1030 | 1054 | 1067 | 1072 |
| 0.7 | 793 | 909 | 965 | 1018 | 1044 | 1059 | 1064 |
| 0.9 | 780 | 898 | 955 | 1010 | 1038 | 1053 | 1059 |
| 1.0 | 775 | 893 | 951 | 1007 | 1035 | 1051 | 1057 |

Figure 5

Table 2:

Estimated Wafer Temperature
with Helium @ 30 torr

- With quartz shield (emissivity = 0.5)
- Wafer emissivity = 0.7
- Temperature Susceptor = 1127C
- Wafer on the susceptor (Gap < 10μm)
- Equilibrium Wafer Temperature in Celsius
- 1-dimensional calculations

| $\varepsilon_{susceptor}$ => $\varepsilon_{wall}$ | 0.1 | 0.2 | 0.3 | 0.5 | 0.7 |
|---|---|---|---|---|---|
| 0.1 | 1077 | 1094 | 1102 | 1109 | 1113 |
| 0.2 | 1062 | 1080 | 1089 | 1100 | 1105 |
| 0.3 | 1055 | 1072 | 1082 | 1093 | 1100 |
| 0.5 | 1047 | 1064 | 1074 | 1086 | 1093 |
| 0.7 | 1044 | 1059 | 1069 | 1081 | 1088 |
| 0.9 | 1042 | 1056 | 1066 | 1078 | 1086 |
| 1.0 | 1041 | 1055 | 1065 | 1077 | 1085 |

Figure 6

SYSTEM AND METHOD FOR THERMAL PROCESSING OF A SEMICONDUCTOR SUBSTRATE

1. REFERENCE TO RELATED APPLICATION

The present application claims priority from provisional application no. 60/019,804 filed Jun. 17, 1996. Provisional application no. 60/019,804 is hereby incorporated herein by reference in its entirety.

2. FIELD OF THE INVENTION

The field of the present invention relates in general to semiconductor processing. More particularly, the field of the invention relates to a system and method for thermally processing a semiconductor substrate using a stable temperature heat source.

3. BACKGROUND

Diffusion furnaces have been widely used for thermal processing of semiconductor device materials (such as semiconductor wafers or other semiconductor substrates). The furnaces typically have a large thermal mass that provides a relatively uniform and stable temperature for processing. However, in order to achieve uniform results, it is necessary for the conditions in the furnace to reach thermal equilibrium after a batch of wafers is inserted into the furnace. Therefore, the heating time for wafers in a diffusion furnace is relatively long, typically exceeding ten minutes.

As integrated circuit dimensions have decreased, shorter thermal processing steps for some processes, such as rapid thermal anneal, are desirable to reduce the lateral diffusion of dopants and the associated broadening of feature dimensions. Thermal process duration may also be limited to reduce forward diffusion so the semiconductor junction in the wafer does not shift. As a result, the longer processing times inherent in conventional diffusion furnaces have become undesirable for many processes. In addition, increasingly stringent requirements for process control and repeatability have made batch processing undesirable for many applications.

As an alternative to diffusion furnaces, single wafer rapid thermal processing (RTP) systems have been developed for rapidly heating and cooling wafers. Most RTP systems use high intensity lamps (usually tungsten-halogen lamps or arc lamps) to selectively heat a wafer within a cold wall clear quartz furnace. Since the lamps have very low thermal mass, the wafer can be heated rapidly. Rapid wafer cooling is also easily achieved since the heat source may be turned off instantly without requiring a slow temperature ramp down. Lamp heating of the wafer minimizes the thermal mass effects of the process chamber and allows rapid real time control over the wafer temperature. While single wafer RTP reactors provide enhanced process control, their throughput is substantially less than batch furnace systems.

While RTP systems allow rapid heating and cooling, it is difficult to achieve repeatable, uniform wafer processing temperatures using RTP, particularly for larger wafers (200 mm and greater). The temperature uniformity is sensitive to the uniformity of the optical energy absorption as well as the radiative and convective heat losses of the wafer. Wafer temperature nonuniformities usually appear near wafer edges because radiative heat losses are greatest at the edges. During RTP the wafer edges may, at times, be several degrees (or even tens of degrees) cooler than the center of the wafer. At high temperatures, generally greater than eight hundred degrees Celsius (800° C.), this nonuniformity may produce crystal slip lines on the wafer (particularly near the edge). To minimize the formation of slip lines, insulating rings are often placed around the perimeter of the wafer to shield the wafer from the cold chamber walls. Nonuniformity is also undesirable since it may lead to nonuniform material properties such as alloy content, grain size, and dopant concentration. These nonuniform material properties may degrade the circuitry and decrease yield even at low temperatures (generally less than 800° C.). For instance, temperature uniformity is critical to the formation of titanium silicide by post deposition annealing. In fact, the uniformity of the sheet resistance of the resulting titanium silicide is regarded as a standard measure for evaluating temperature uniformity in RTP systems.

Temperature levels and uniformity must therefore be carefully monitored and controlled in RTP systems. Optical pyrometry is typically used due to its noninvasive nature and relatively fast measurement speed which are critical in controlling the rapid heating and cooling in RTP. Increasingly complex systems have been developed for measuring emissivity and for compensating for reflected radiation.

While these systems have enhanced wafer temperature uniformity, their complexity has increased cost and maintenance requirements. In addition, other problems must be addressed in lamp heated RTP systems. For instance, many lamps use linear filaments which provide heat in linear segments and as a result are ineffective or inefficient at providing uniform heat to a round wafer even when multi-zone lamps are used. Furthermore, lamp systems tend to degrade with use which inhibits process repeatability and individual lamps may degrade at different rates which reduces uniformity. In addition, replacing degraded lamps increases cost and maintenance requirements.

In order to overcome the disadvantages of lamp heated RTP systems, a few systems have been proposed which use a resistively heated plate. Such heated plates provide a relatively large thermal mass with a stable temperature.

While heated plate rapid thermal processors provide a stable temperature on the heated plate that may be measured using a thermocouple, problems may be encountered with wafer temperature nonuniformities. Wafers may be heated by placing them near the heated plate rather than on the plate. In such systems, the edges of the wafer may have large heat losses which lead to nonuniformities as in lamp heated RTP systems. Even when a wafer is placed in contact with a heated plate, there may be nonuniformities. The heated plate itself may have large edge losses, because: 1) the corners and edges of the plate may radiate across a wider range of angles into the chamber; 2) vertical chimney effects may cause larger convective heat losses at the edges of the heated plate; and 3) the edges of the heated plate may be close to cold chamber walls. These edge losses on the plate may, in turn, impose temperature nonuniformities upon a wafer placed on the plate. In addition, heat loss and temperature uniformity across the wafer surface varies with temperature and pressure.

As a result of the problems associated with conventional heated plate rapid thermal processors, they have not been adopted in the industry as a viable alternative to lamp heated RTP systems. A 1993 survey of RTP equipment covering twenty two different vendors' products indicates that, at the time of the survey, only one non-lamp system was available. See Roozeboom, "Manufacturing Equipment Issues in Rapid Thermal Processing," Rapid Thermal Processing at 349–423 (Academic Press 1993). The only non-lamp system listed uses a resistively heated bell jar with two temperature zones and is not a heated plate reactor. See U.S. Pat. No. 4,857,689 to Lee. Currently, the RTP market is dominated by lamp based systems and despite the many problems associated with such systems, they have been widely accepted over proposed heated plate approaches. Despite the potential that heated plate approaches offer for a stable and repeatable heat source, it is believed that problems with energy efficiency, uniformity, temperature and heating rate control, and the deployment of fragile, noncontaminating resistive heaters have made such systems unacceptable in the marketplace.

A system which overcomes many of the disadvantages of the prior art is described in U.S. pat. application Ser. No. 08/499,986 filed Jul. 10, 1995, which is hereby incorporated herein by reference in its entirety. The system described in application Ser. No. 08/499,986 provides good temperature uniformity and high throughput using a large thermal mass resistive heater and an insulated processing region at low pressure to control heat transfer.

What is desired are an improved method and apparatus for providing insulation and controlling heat transfer in a rapid thermal processing system. Preferably, such improvements may be used in a system such as that described in application Ser. No. 08/499,986 while providing better insulation, higher thermal uniformity in the processing region, and reduced potential for slip as substrates are placed into the processing region for heating and removed for cooling.

SUMMARY OF THE INVENTION

One aspect of the present invention provides a semiconductor substrate processing system with an insulated thermal processing region. Insulating walls with a high reflectivity are used to insulate the thermal processing region. In an exemplary embodiment the insulating walls may comprise a reflective material placed between pieces of a substantially inert insulating material. In particular, a polished metal plate may be enclosed between pieces of clear or opaque quartz. In some embodiments, the metal plate may have a reflective side facing the thermal processing region and a rough or dark side facing away.

It is an advantage of these and other aspects of the present invention that improved insulation from heat transfer by radiation may be provided in a semiconductor substrate processing system. It is a further advantage that highly reflective materials may be used without introducing contaminants due to encapsulating in an inert insulating material.

Another aspect of the present invention provides a low emissivity heating surface. In an exemplary embodiment, the heating surface comprises a highly reflective material covered by a substantially inert insulating material such as clear or opaque quartz.

Another aspect of the present invention provides for improved thermal uniformity in an insulated thermal processing region. In an exemplary embodiment, multiple layers of insulation may be used. Actively heated walls may also be used. In addition, a conductive gas may be added to the processing region to enhance heat transfer from a heat source to a semiconductor substrate being processed. It is an advantage of these and other aspects of the present invention that thermal uniformity of the processing region may be enhanced.

Another aspect of the present invention provides for heating a semiconductor substrate in stages to reduce the potential for slip. In an exemplary embodiment, a substrate may be initially heated on pins separated a distance from a heating surface. After initial heating, the substrate may be placed on or nearer to the heating surface for further heating. Heating may be further enhanced by providing conductive gas into the processing region. The gas may be removed after processing for initial cooling. The substrate may be moved away from the heating surface within the processing region for further cooling before being removed. A cool gas may also be provided to the processing region for further cooling before removal.

It is an advantage of these and other aspects of the present invention that a substrate may be heated and cooled in controlled stages to avoid slip due to rapid non-uniform temperature changes.

BRIEF DESCRIPTION OF THE DRAWINGS

These and other advantages of the present invention will become more apparent to those skilled in the art from the following detailed description in conjunction with the appended drawings in which:

FIG. 5 is a table showing estimated wafer temperature in an exemplary thermal processing chamber without a conductive gas;

FIG. 6 is a table showing estimated wafer temperature in an exemplary thermal processing chamber with helium at 30 torr in accordance with an exemplary embodiment of the present invention.

DETAILED DESCRIPTION

The present invention relates generally to an apparatus and method for thermally processing a substrate. Techniques according to the present invention may be used in a wide variety of thermal processing reactors. In an exemplary embodiment, such techniques are incorporated into a thermal reactor such as that described in copending application Ser. No. 08/499,986 filed Jul. 10, 1995, which is hereby incorporated herein by reference in its entirety.

Figure 1:
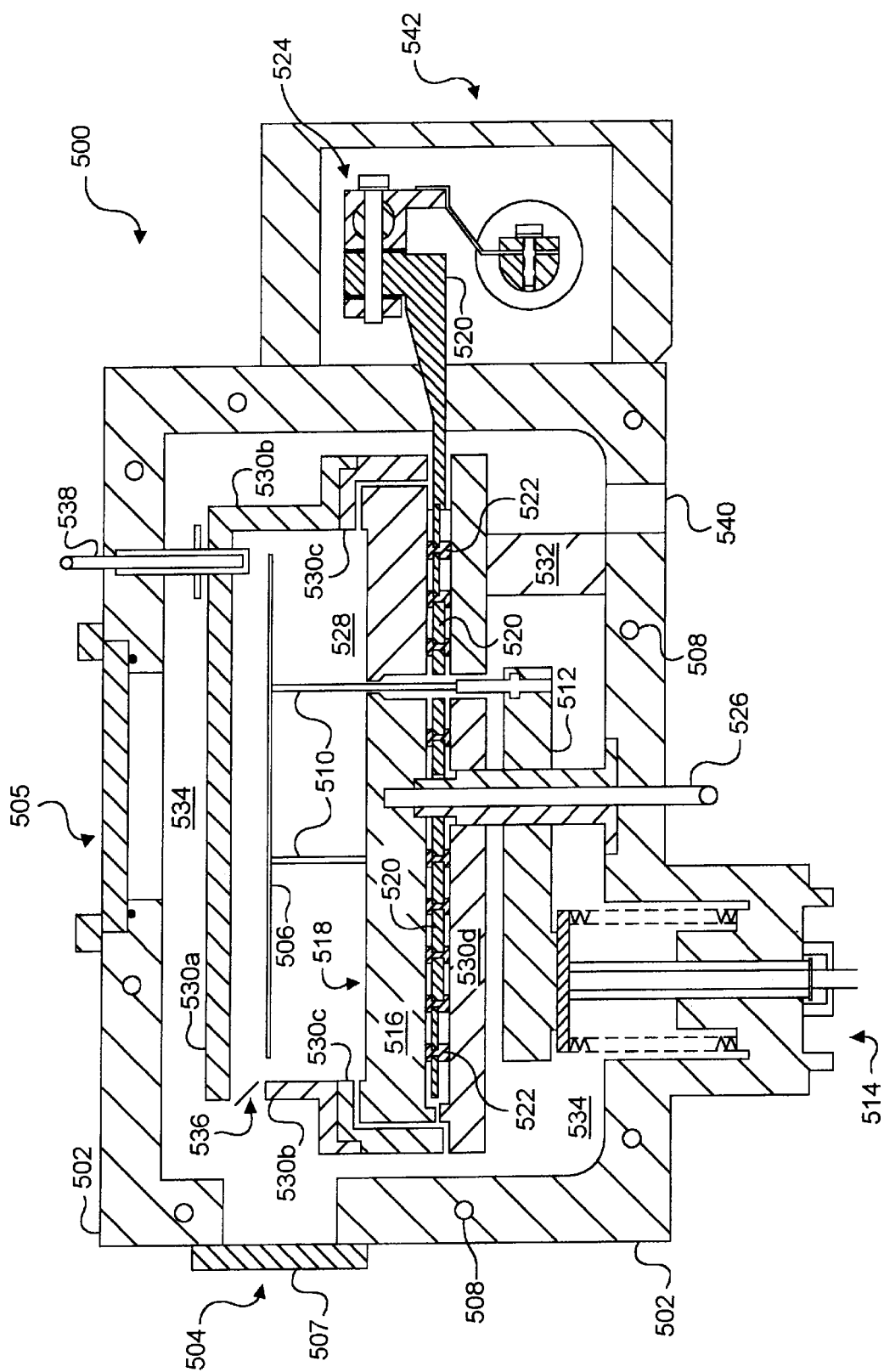
FIG. 1 is a side cross sectional view of an exemplary thermal processing chamber.
Figure 2A:
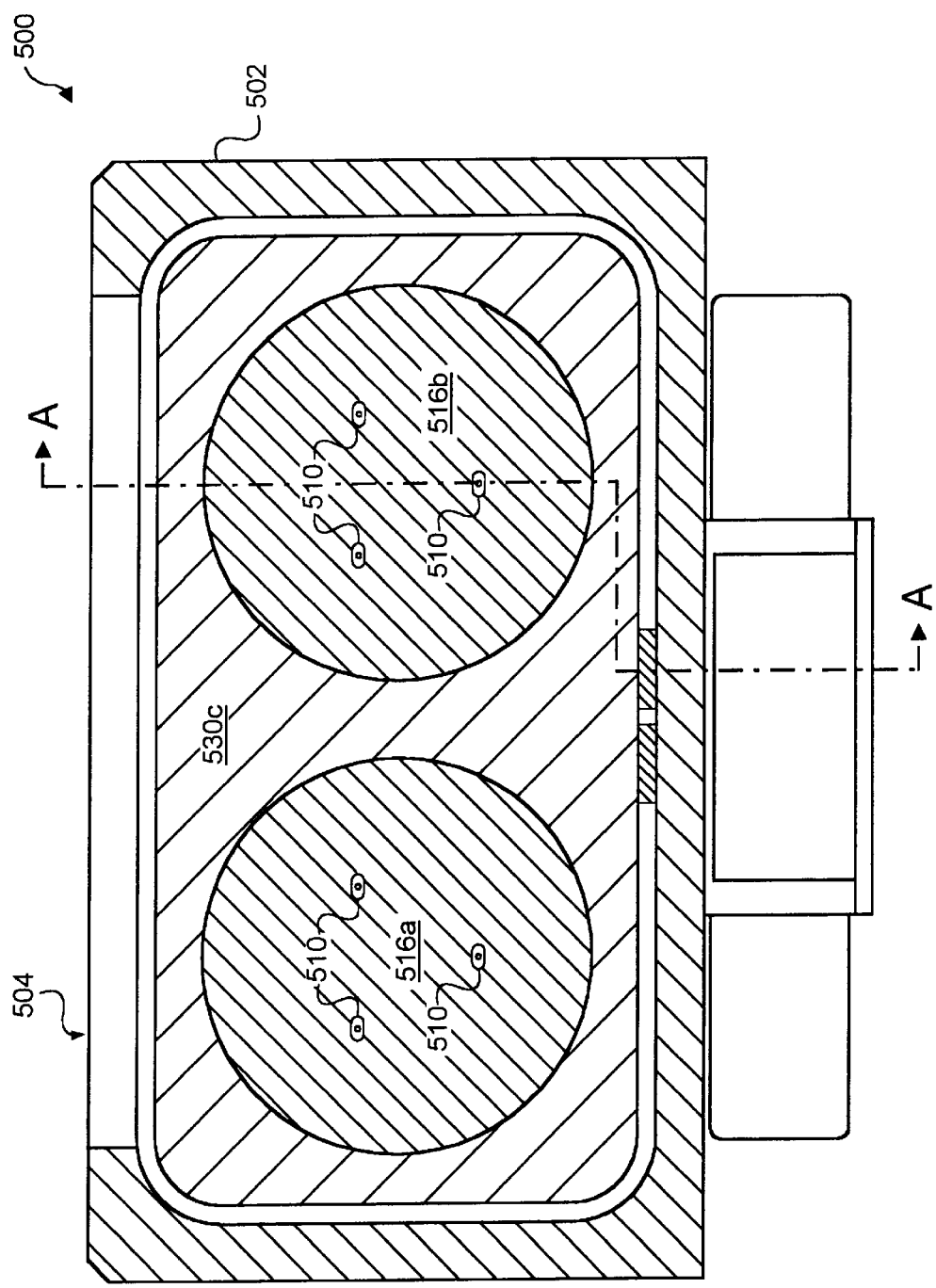
FIG. 2A is a top cross sectional view of an exemplary thermal processing chamber.
Figure 2B:
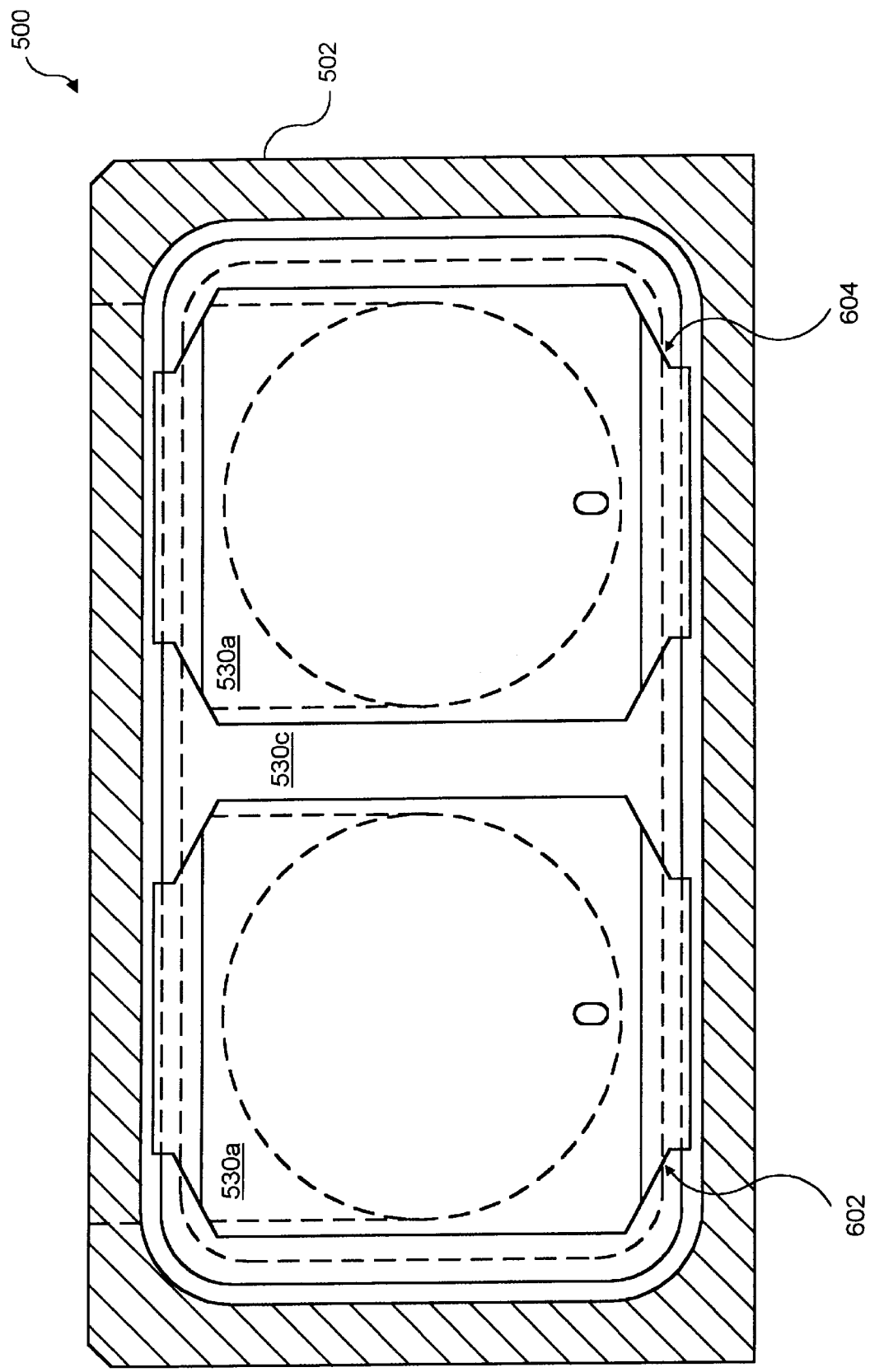
FIG. 2B is a top cross sectional view of an exemplary thermal processing chamber with insulating hoods in place.

FIG. 1 is a side cross sectional view of a thermal processing chamber, generally indicated at 500, according to the first embodiment of the present invention. FIG. 2A is a top cross sectional view of the thermal processing chamber according to the first embodiment with insulating hoods removed, and FIG. 2B is a top cross sectional view of the thermal processing chamber according to the first embodiment with insulating hoods in place. The first embodiment of the present invention is preferably designed for use in conjunction with the Aspen™ wafer handling system available from Mattson Technology Inc., assignee of record of the present invention. The Aspen™ system allows two wafers to be handled at a time and, as indicated in FIG. 2A, the chamber according to the first embodiment has two wafer processing stations. The dashed line A in FIG. 2A indicates the location of the side cross section of FIG. 1 which shows one of these processing stations. Aspects of the present invention allow a single stable heat source to be used for uniformly processing two wafers at a time. As a result, titanium silicide anneal may be carried out in the chamber of the first embodiment with a high throughput and a process uniformity better than typical multi-zone lamp systems. Of course, a wide variety of processes may be carried out and alternative embodiments may be optimized for processing a single wafer at a time. Techniques described below may also be applied to allow uniform processing of more than two wafers at a time.

Referring to FIG. 1, the chamber walls 502 in the first embodiment form an outer port 504 through which a semiconductor substrate, such as wafer 506, may be introduced into the chamber 500. A conventional load lock mechanism (such as provided by the Aspen™ system) may be used for inserting and removing wafer 506 through outer port 504. After the wafer has been loaded into chamber 500, a plate 507 is used to cover outer port 504. In addition, a viewing window 505 may be provided for, among other things, end point detection, in situ process monitoring and wafer top surface temperature measurement. If a window is used for these purposes, a small hole or clear section must be provided through any internal chamber surfaces, such as insulating walls, to allow the wafer to be viewed. When a window is not used, a nontransmissive plate may be used to cover the viewing port for improved insulation.

Chamber walls 502 are relatively cold, preferably being maintained at an average temperature less than one hundred degrees Celsius (100° C.). In the first embodiment, chamber walls 502 are aluminum and are cooled by cooling channels 508. Water or another cooling media may be pumped through cooling channels 508 to cool the aluminum chamber walls 502.

After the wafer is introduced into the chamber, it is placed upon narrow pins 510 which comprise silicon carbide or ceramic in the first embodiment. The pins are mounted on a pin support plate 512 that may be raised and lowered by an elevational mechanism 514, such as a pneumatic or electromechanical lift with a vacuum sealed bellows. After the wafer is loaded into the chamber and placed on pins 510, the elevational mechanism 514 is lowered to place wafer 506 close to or onto a heated block 516 for thermal processing.

The heated block preferably has a large thermal mass that provides a stable and repeatable heat source for heating wafer 506. Preferably, heated block 516 provides a heating surface 518 within the chamber that is substantially parallel to the wafer to allow heat transfer across the entire backside surface area of the wafer. Heated block 516 comprises a material that will not contaminate wafer 506 even when the wafer is placed in contact with the heated block at high temperatures (greater than 500° C.) and low pressures (less than 100 Torr). In the first embodiment, heated block 516 comprises silicon carbide coated graphite, although other materials that will not react with the wafer at processing temperatures such as silicon carbide or quartz may be used as well. A material with high thermal conductivity is preferred to allow heat to uniformly dissipate through the block. Insulating techniques described below are used to prevent sharp temperature gradients from forming in the heated block due to heat losses at the edges of the block.

The heated block is approximately one (1) inch thick in the first embodiment and provides a thermal mass substantially larger than the wafer which is only about thirty five thousandths (0.035) of an inch thick. It is preferred that heated block 516 be at least ten times thicker than the wafer that is being processed. This provides a stable temperature heat source for thermally processing wafer 506.

In the first embodiment, a single heated block 516 extends across most of the chamber and provides a generally rectangular heating surface large enough to process two wafers at a time as shown in FIG. 2A. The exposed regions 516a and 516b in FIG. 2A are portions of the same heated block. Using a single heated block provides a simplified and cost effective design. However, the heated block cannot be easily rotated to rotate the wafers during processing. Wafer rotation is often desired to enhance uniformity in semiconductor processing. The thermal processing chamber of the first embodiment provides exceptional processing uniformity even with a simplified non-rotating design. In alternative embodiments, a separate rotating heating plate may be provided for each wafer to further enhance uniformity. The wafers could also be held slightly above the heated plate and rotated on pins. However, the chamber according to the first embodiment provides excellent uniformity without rotation, so a simplified and cost effective design is preferred.

The heated block is heated by a resistive heater 520 positioned below the heated block. The resistive heater preferably comprises silicon carbide coated graphite although other materials may also be used. The design of the resistive heater is described in detail in application Ser. No. 08/499,986 incorporated herein by reference. Heater support pins 522 space the resistive heater from heated block 516 by a short distance (approximately 0.125 of an inch). A power source (not shown) is connected to the heater. Current is driven through resistive heater 520 to heat the heated block 516 which in turn acts as a stable heat source for wafer 506. The power applied to the resistive heater may be adjusted to control the temperature of the heated block. A thermocouple 526 or other temperature sensor may be used to measure the temperature of the heated block. An optical pyrometer or thermocouple (not shown) may also be used to measure the wafer temperature directly. The temperature sensors send signals indicative of the temperature of the heated block and/or wafer to a conventional temperature control system (not shown). The temperature control system then causes a transformer or other power source to apply an appropriate amount of power to the resistive heater to achieve the desired processing temperature. Typically temperatures between five hundred degrees Celsius (500° C.) and one thousand degrees Celsius (1000° C.) are used for thermal processing in the chamber according to the first embodiment.

Of course other mechanisms may be used to provide a stable heat source. For instance, an RF coil could be used to induce a current in a conductive plate within the chamber or lamps could be used to heat the backside of a conductive block. However, the resistive heater and heated block of the first embodiment provide an exceptionally stable and durable heat source and are preferred.

In order to reduce heat loss and enhance uniformity, heated block 516 and wafer 506 are enclosed within an insulated heating chamber 528. Heating chamber 528 is formed by insulating walls 530a–d spaced apart from heater 520, heated block 516 and wafer 506. The insulating walls 530a–d preferably comprise a material that has a low thermal conductivity. In addition, insulating walls 530a–d are preferably highly reflective and substantially nontransmissive to thermal radiation (particularly in the visible and infrared regions). Thus, insulating walls 530a–d substantially prevent heat transfer by direct radiation from within heating chamber 528 to cold chamber walls 502. This thermal insulation may be achieved by using opaque quartz. Opaque quartz is durable and inert in virtually all processes, has a high reflectivity and low conductivity, and may be used to form an insulating wall using a single intrinsic piece of material. Opaque Silica Glass OP-1from Nippon Silica Glass U.S.A., Inc. is an exemplary opaque quartz. In contrast to transparent quartz, opaque quartz is white with a nearly ideal opaque appearance. This is due to the special structure of the material which has a well-controlled distribution of micropores in the otherwise dense matrix, scattering light and thermal radiation in a very efficient and homogeneous way. Thus, the direct transmission of radiation is nearly completely suppressed (less than 1% transmission across wavelengths from 200 to 5000 nm for 3 mm path length). The surface of the opaque quartz is preferably treated to inhibit flaking and the release of particulates. This is accomplished in the first embodiment by exposing the surfaces of the opaque quartz to high temperatures which glaze the surfaces. This forms a shallow layer (approximately 1 mm deep) of clear durable quartz on the exterior surfaces of the insulating walls which acts as a protective coating.

One problem with opaque quartz is that it has high emissivity [≅0.5] which makes it less effective as thermal insulation. If, however, we were to use lower emissivity materials, such as metals, they typically would either not be able to tolerate the heat or risk heavy metal contamination of the wafer. In an exemplary embodiment of the present invention, we put a polished refractory metal plate having high reflectivity between two thin plates of quartz—effectively a sandwich—and sealing the edges of the quartz plates so as to prevent the chamber environment from being exposed to the vapors from the region containing the metal. The metal may be sealed in an inert gas inside the quartz plates or the region may be evacuated. It is preferred that the reflective surface of this metal not be clouded by oxidation or other chemical reaction with the gaseous ambient.

In order to use the above "heat mirror" the polished "shiny" side of the metal is placed toward the volume which is to be kept hot (i.e., insulated heating chamber 528). The metal should be capable of high temperatures without melting or even annealing or recrystallizing (i.e. having grain growth). One such metal capable of high temperature is Tungsten; another is palladium or platinum. One desirable configuration for a heat mirror has both sides of the metal polished and shiny, but some applications, such as those where the mirror needs to be kept as cool as possible, would have one shiny side toward the hot region and a rough and/or dark side facing away from the hot region. In some applications one might have the dark side toward the hot region and the shiny side away—this causes the metal to present a low emissivity surface to the outside. As described below, this configuration can be used to provide a low emissivity heated surface for processing wafers. The dark side would face a heater and the wafer would be placed near or on the shiny side. One way to darken one side would be to carbon coat it or cause it to be oxidized or reacted to form a patina.

Figure 3:
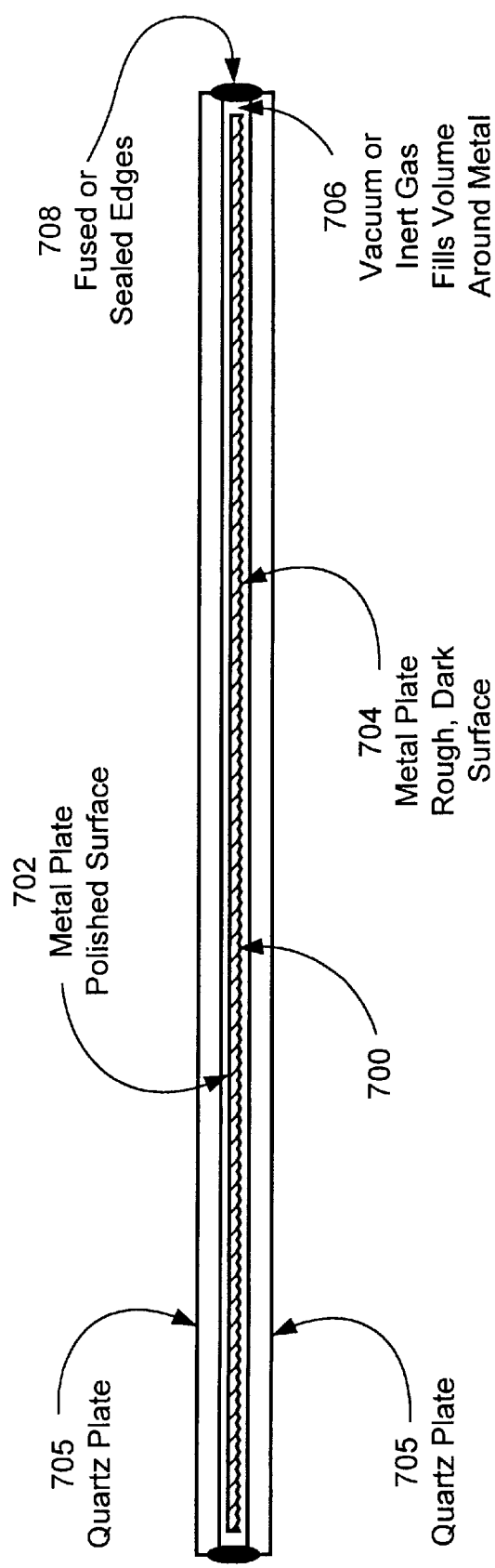
FIG. 3 is an insulating wall according to an exemplary embodiment of the present invention.

FIG. 3 illustrates an exemplary configuration for the quartz encapsulated mirror described above. Such a mirror may be used to form insulating walls 530*a–d*. A metal plate 700 is encapsulated in clear quartz between quartz plates 705 (although other inert material such as opaque quartz could be used). A polished surface 702 of metal plate 700 may face the insulated heating chamber 528 and a rough dark surface 704 may face the cool chamber walls 502. Any enclosed space 706 could be vacuum sealed or filled with gas (at 30–50 Torr for example) and the ends 708 may be fused or sealed. When used for insulation an inert gas such as argon or xenon might be used. If it is desirable to conduct heat (e.g., for a low emissivity heated surface), a more thermally conductive gas such as helium might be used.

Such mirrors can be used as insulating walls 530*a–d* to provide heat insulation or in addition to quartz insulating walls. Such mirrors could also be used in place of the heated block to provide a low emissivity heated surface.

It is preferred that the material used for the insulating walls have a thermal conductivity less than five Watts per centimeter Kelvin (5 W/cmK) in the first embodiment although it will be readily understood that the thickness, thermal conductivity, and transmission of the material may be varied to achieve a desired level of insulation. Additional insulating walls may also be positioned between the heating chamber and chamber walls to improve insulation. In particular, the heating chamber may be enclosed within multiple insulating housings with vacuum regions formed between the housings.

As shown in FIG. 1, four insulating walls—a top 530*a*, side 530*b*, base 530*c*, and bottom 530*d*—are used to form heating chamber 528 in the first embodiment. The insulating walls may be formed by encapsulating a reflective material in quartz as described above with reference to FIG. 3. The top and side insulating walls may be arranged to form an insulating hood that may be placed over each wafer processing station as indicated in FIG. 2B. As shown in FIG. 1, the base 530*c* and bottom 530*d* insulating walls are closely spaced to the heated block 516 and resistive heater 520. In the first embodiment, the base 530*c* and bottom 530*d* insulating walls substantially encapsulate the heat source except for exposed circular regions of the heating surface which are shaped to receive the wafers as shown at 516*a* and 516*b* in FIG. 2A. This helps channel the heat flux from the heat source through a circular region normal to the wafer surface and reduces lateral thermal gradients. In addition, the heating surface extends radially from the circular region underneath the base insulating wall 530*c*. This helps isolate the wafer from any temperature drop off at the edge of the heated block. As shown in FIG. 1, the heated block forms shallow pockets for receiving the wafers in the circular regions that are left exposed by the base insulating wall 530*c*. The pockets are between one sixteenth (0.0625) and one eighth (0.125) of an inch deep in the first embodiment and may be flat, slightly concave with the center of the pocket being slightly lower (approximately 0.003 inches) than the perimeter of the pocket, or stepped with the center recessed relative to a ledge formed about the outer radius of the pocket. Recessed pockets help retain heat at the edges of the wafer and the pocket shape may affect temperature uniformity across the wafer surface. Nevertheless, outstanding process uniformities have been achieved at six hundred degrees Celsius (600° C.) and eight hundred degrees Celsius (800° C.) using both flat and recessed pocket designs.

The top cross section of FIG. 2A shows the chamber of the first embodiment without the top 530*a* and side insulating wall 530*b*. FIG. 2B shows a top view of the chamber with insulating hoods (which provide the top 530*a* and side 530*b* insulating walls) placed over each wafer processing station as indicated at 602 and 604. As shown in FIG. 2B, a separate insulating hood is placed over each wafer pocket although a single hood enclosing both pockets may be used as well. Other configurations, such as cylindrical hoods around each wafer pocket, may also be used.

The insulating walls 530*a–d* substantially enclose the heating chamber 528 and form an outer insulating chamber 534 between the insulating walls and the cold chamber walls. The insulating walls form an inner port 536 between the heating chamber 528 and insulating chamber 534 to allow a wafer to be inserted into the heating chamber. A piece of insulating material may be used to cover the inner port 536 during processing to provide additional insulation. Generally, heat is transferred in the first embodiment from the heated plate 516, across the heating chamber 528 to the insulating walls 530a–d, through the insulating walls 530a–d and across the insulating chamber 534 to the cold chamber walls 502. Of course, some heat may be transferred through support leg 532 by conduction and through inner port 536 by direct radiation (unless an opaque cover is used). However, a substantial majority (more than 90%) of the radiation from the heated block 516 is intercepted by the insulating walls 530a–d and only a small portion of the bottom insulating wall (less than 10%) is in contact with the support leg. Thus, the rate of heat transfer in the first embodiment is substantially dependent upon the thermal resistance across the heating chamber 528, through the insulating walls 530a–d, and across the insulating chamber 534.

The thermal resistance across the heating chamber and insulating chamber can be adjusted by adjusting the processing pressure. Tube 538 provides a gas inlet and gas exhaust port 540 provides a gas outlet. The tube 538 is connected to a conventional gas source (not shown) and gas exhaust port 540 is connected to a conventional vacuum pump (not shown) which allows the pressure in the chamber to be controlled. In the first embodiment, pressures from seven hundred sixty (760) Torr (atmospheric) down to less than one tenth (0.1) of a Torr may be achieved. Pressures less than one hundred (100) Torr, and in particular pressures between two (2) Torr and fifty (50) Torr, are typical in the first embodiment.

Figure 4:
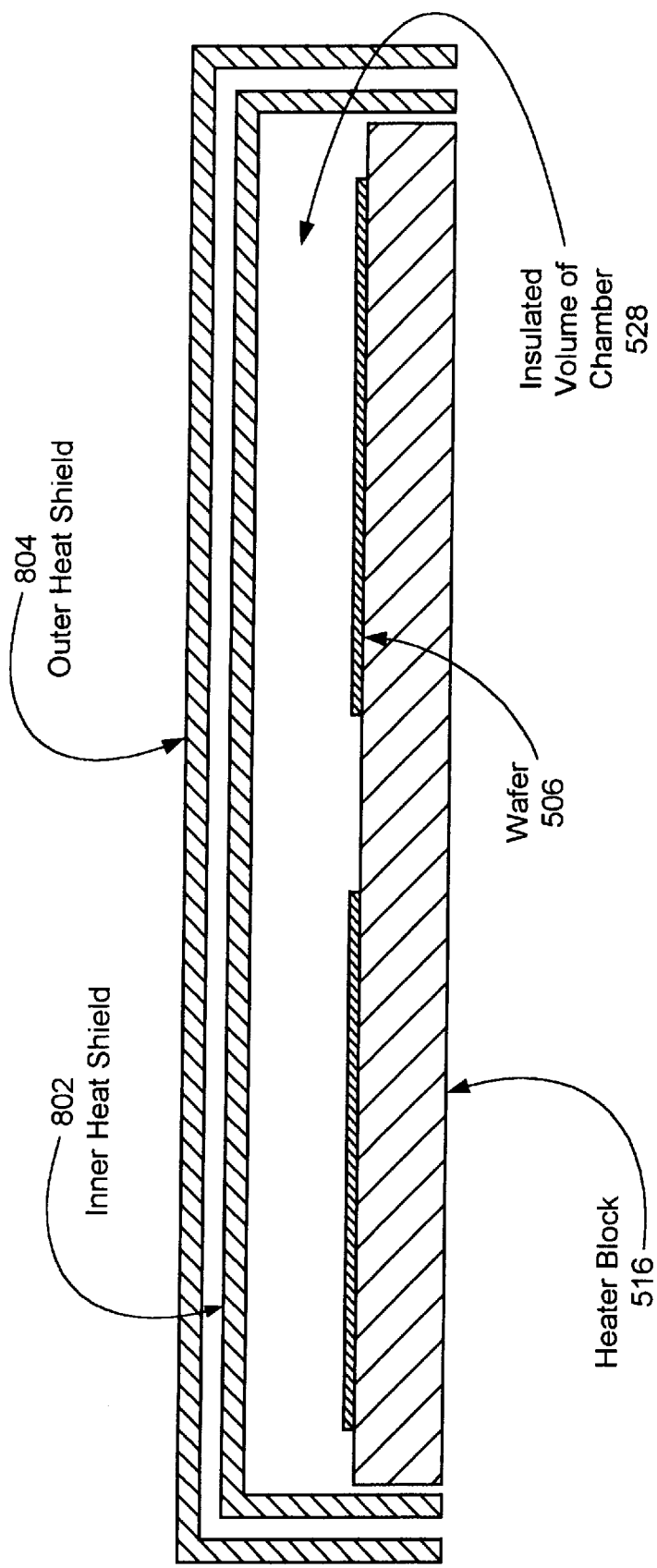
FIG. 4 is a side cross section of a portion of an exemplary thermal processing chamber with inner and outer insulating walls according to an exemplary embodiment of the present invention.

One requirement in thermal processing of semiconductor wafers is that the temperature that the substrates are exposed to be measurable, controllable and stable for each wafer and from wafer to wafer. In the exemplary system described above the controllability and stability are provided by a massive heater block whose temperature is stable and monitored so it is controlled precisely. The temperature of the wafer on the block may or may not be measured by infrared pyrometry. If it is not, or if varying the block temperature from lot to lot or wafer to wafer to maintain constant wafer temperature is not desired, then (because the emissivity of the wafer's front and back sides may be variable from wafer to wafer or lot-to-lot) the wafer's temperature needs to be substantially independent of its emissivity. If, however, the wafer environment in the insulated process chamber has elements with different temperatures (i.e., if the heat insulation above the wafer is at a lower temperature than the heater block, as it will be in (if the insulation is not independently heated) radiative equilibrium) then the wafer temperature will vary depending on both its front and backside emissivities, which may vary from 0.3 to 0.9, when it is in radiative equilibrium. In order to reduce this temperature variability it suffices to make the insulated process chamber a substantially isothermal cavity or improve conduction from heater block to wafer. In the exemplary chamber this can be done by improving the heat insulation above the wafer or improving conduction using either:

1) Additional layers of heat shielding or more reflective heat shielding such as the mirror described above. For instance, we can reduce the dependence of the wafer temperature on the wafer emissivity by having two layers of heat shielding. See FIG. 4 which illustrates an exemplary configuration with an inner heat shield 802 and an outer heat shield 804. Because the outer layer of shielding causes the temperature of the inner shielding to increase and be closer to the temperature of the heater block the wafer temperature becomes less dependent on the emissivity of either its front or back sides. More shields or shields with lower emissivity make the inner shield temperature even closer to the block. If either or both of these shields is a mirror such as described above in conjunction with FIG. 3 and this mirror has both sides shiny, then the heat insulation of the wafer and heater block will be improved and the temperature of the wafer will depend less on what front and backside emissivities are of the wafer. Emissivity from 0.05 to 0.2 is considered low for purposes hereof.

2) An actively heated shield above the wafer, whose temperature is controlled to be equal to heated block below the wafer. Such shield could be a resistively heated plate parallel to and above the wafer for example. It could be placed below the top of the insulating hood described above or used in its place. Active heaters could also be used around the sides of the wafer (for example, in place of the sides of the insulating hoods) to make the cavity more isothermal.

3) Augmenting the gaseous heat conduction from the heater block to the wafer by positioning the wafer very close to the heater block (<0.5 mm) and putting highly conductive gases such as Helium or Hydrogen in the process chamber at high enough pressure to significantly augment the radiative heat transfer from the heater block to the wafer. Typically, this requires pressures above 2 Torr, up to as much as 50 Torr, depending on the spacing of wafer to heater. The mean free path for collisions of the gas atoms or molecules should be somewhat less than the gap between the wafer and the heater block.

If the volume of the chamber is filled with conductive gas such as helium or hydrogen such that the area between the wafer and the heater block is occupied by the gas at pressures of 1 Torr to 100 Torr the gas will conduct heat from the block to the wafer. If the gap between block and wafer is less than 0.2 mm the conducted heat can be a significant part of total heat transfer. This conduction heat is independent of the emissivity of the wafer, and therefore causes the equilibrium temperature of the wafer to be less dependent on the wafer emissivity.

In the thermal processing of semiconductor wafers it is necessary for some processes to raise the wafer temperature above the level at which crystal planes can slip when the wafer is under thermal or mechanical stress. Processes can be as high as 1150° C. while the temperature at which "slip" occurs is as low as 900° C. to 950° C. for large stresses. This must be avoided and to do so requires strictly limiting the temperature variation across the wafer. Because the wafer temperature is most controlled and uniform when the wafer is in best thermal contact with the heater block, and because it can also be physically supported in the least stressful manner while there, an embodiment of the present invention controls the wafer temperature such that it only rises above the "slip" limit while in closest contact with the heater block. This is done by reducing the emissivity of the heater block where it is visible to the wafer and using substantial gas conduction heat transfer from the heater to the wafer. ($\epsilon_{HB} \leq 0.7$)

In this approach the wafer is inserted into the insulated exemplary process chamber described above and held up on pins 510 away from heating surface 518 until it heats to 700° to 850° C. Then it is lowered to the heating surface 518 and, possibly with some delay, gas is introduced into the process chamber until gas conduction heating is substantial relative to radiative heat transfer. This gas causes the wafer temperature to rise to very nearly equal the heater block temperature. (Without the gas the wafer only rises to the radiative equilibrium temperature which may be well below that of the heater block. If the heater block has a lower emissivity—from 0.3 to 0.7—then the temperature of the wafer may be as low as 100° to 150° below that of the heater.) A very small gap may be left between the wafer and heater block in some embodiments (less than about 0.2 mm) to allow gas to flow between the wafer and heater block. Once the gas is introduced the wafer becomes better thermally coupled to the heater and rises to process temperature. When the process is done the gas is pumped out and the wafer cools down to radiative equilibrium temperature. If this is not below the "slip" temperature then additional cooling of the wafer is needed and this may be done by flowing cool gas across the wafer surface. If gas cooling is not desired then the radiative equilibrium temperature may be made lower by increasing the emissivity of the cooled chamber wall and decreasing the emissivity of the top side of the heater block. Gas cooling of the wafer requires significant flow of gas and may be done form a showerhead or a manifold. Typically it takes 100 slpm of gas to provide 20 to 50° C. of wafer cooling.

Figure 7:
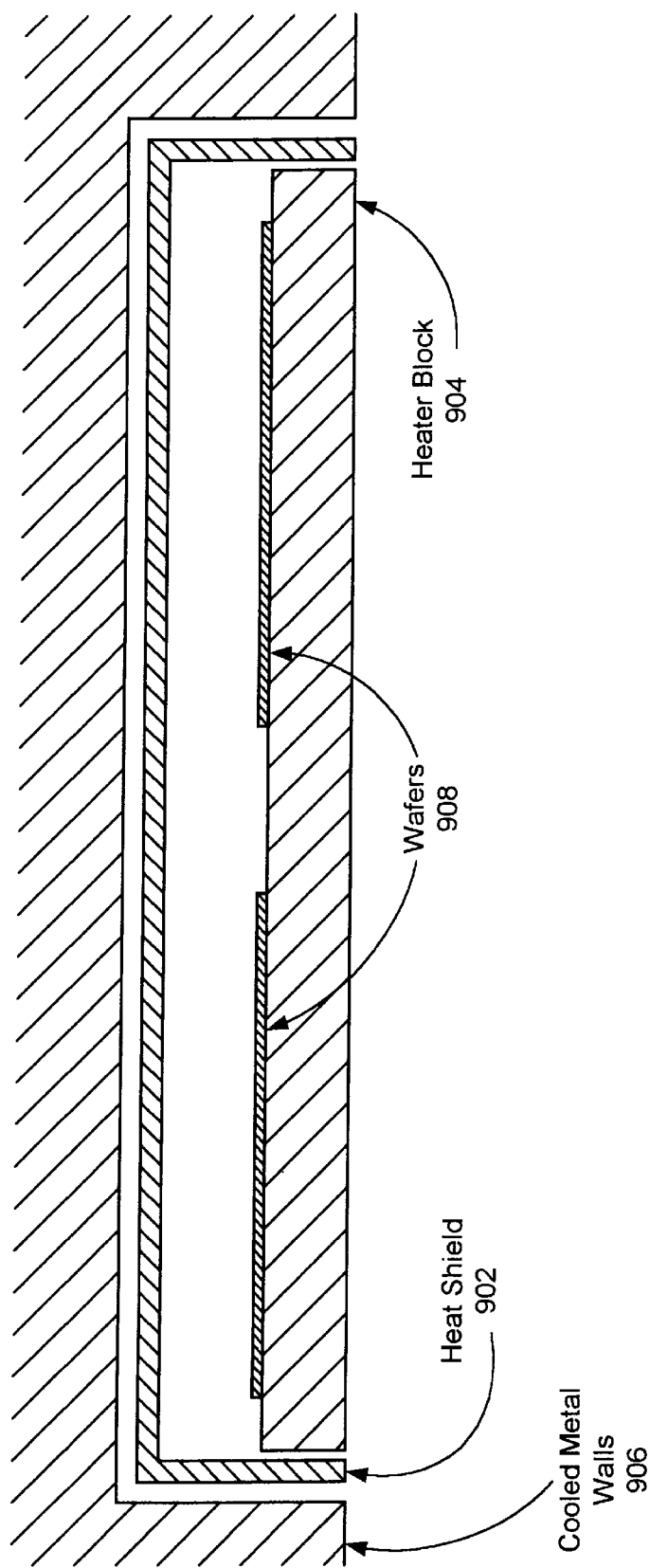
FIG. 7 is a side cross section of a portion of an exemplary thermal processing chamber configuration used for the tables shown in FIGS. 5 and 6.

In some embodiments the wafer may be raised on pins prior to the use of cold gas for cooling. This should be acceptable since the wafer will already have cooled to nearly radiative equilibrium temperature which should be no more than 1000° for a 1100° process temperature in such embodiments. The table in FIG. 5 shows the radiative equilibrium temperature of the wafer calculated from the resistive heat flow method. This assumes a single heat shield 902 between the heater block 904 and the cooled wall 906 as shown in FIG. 7 with emissivity 0.5 as shown in the table in FIG. 5. (Wafer emissivity is assumed to be 0.7 and heater block temperature 1127° C.)

The table in FIG. 6 shows the wafer temperature when the effect of gas conduction with helium is included at a pressure of 30 Torr with very small gap between heater and wafer 908 ($\leq 0.01$ mm). The conditions (emissivities) of the heater and walls are the same in both tables. It is notable that the wafer temperature is more than 100° C. higher in the gas heating case than the pure radiative case. Note that in this example, no combination of wall and heater emissivity produces a wafer temperature less than 950° C. for radiative equilibrium (without gas conduction) but greater than 1100° C. for equilibrium with gas conduction. However, in an embodiment with a hotter heater block ($\geq 1200°$ C.) it is true that for $E_{wall}=0.3$ and $E_{suspensor}=0.1$ the required upper and lower temperature limits may be attained. Such an embodiment can be used to perform the desired process sequence.

Such an embodiment may use an aluminum walled chamber with non-polished walls ($E_{wall} \cong 0.3$) using a single layer heat shield with $E_{shield} \cong 0.5$ (this could be made, for instance, of opaque quartz). The heater block could be made of a thick piece of graphite coated with silicon carbide to make it inert chemically, then covered with the quartz enveloped Tungsten mirror shown in FIG. 3. The back side of the tungsten would be dark to absorb heat from the heater and the shiny side would face the wafer to provide a low emissivity heating surface.

The mirror can also be made of a plate of metal with thin coatings of quartz on both sides. It can also be made of a plate of quartz which is coated with a thin layer of refractory metal which may be blackened on the exposed side and then sealed with a thin coating of quartz or with a second quartz plate which covers the metal layer and is sealed on the edges to the first quartz plate.

The resulting embodiment is capable of using conductive gas to heat a wafer through the slip range while it is in close proximity to the low emissivity heated surface. The gas can be removed to cool the wafer below the slip range before the wafer is removed. This is all done without changing the heater temperature directly (which has a large thermal mass). As a result a stable temperature can be maintained for process repeatability while avoiding problems with slip.

While this invention has been described and illustrated with reference to particular embodiments, it will be readily apparent to those skilled in the art that the scope of the present invention is not limited to the disclosed embodiments but, on the contrary, is intended to cover numerous other modifications and equivalent arrangements which are included within the spirit and scope of the following claims.

What is claimed is:

1. A thermal processor for processing a semiconductor substrate comprising:

a processing chamber having a chamber wall;

a heat source providing at least one heated surface in the processing chamber adjacent to which the semiconductor substrate is placed for thermal processing; and a first insulating housing that is substantially non-transmissive to thermal radiation from the heated surface, the first insulating housing forming an insulated heated cavity substantially enclosing the semiconductor substrate such that direct radiation from the heated surface and the semiconductor substrate to the chamber wall is substantially avoided during the thermal processing;

wherein the first insulating housing comprises a reflective material sealed within a substantially inert material such that contamination from exposure of the reflective material to the heated cavity, the semiconductor substrate and the heated surface is avoided.

2. The thermal processor of claim 1 wherein the reflective material is selected from the group consisting of tungsten, palladium and platinum.

3. The thermal processor of claim 1 wherein the substantially inert material comprises quartz.

4. The thermal processor of claim 1 wherein the reflective material forms a first reflective surface facing the heated cavity and a second reflective surface facing the chamber wall.

5. The thermal processor of claim 1 wherein the reflective material forms a reflective surface facing the heated cavity and wherein the insulating housing includes a substantially less reflective surface facing the chamber wall and being positioned substantially opposite the reflective surface.

6. The thermal processor of claim 1 wherein the inert material forms an enclosed space within which the reflective material is vacuum sealed.

7. The thermal processor of claim 1 wherein the inert material forms an enclosed space within which the reflective material is sealed with an inert gas.

8. The thermal processor of claim 1 further comprising a second insulating housing for insulating the heated cavity, the second insulating housing being positioned between the first insulating housing and the chamber wall.

9. The thermal processor of claim 8 wherein the second insulating housing comprises opaque quartz.

10. The thermal processor of claim 8 wherein the first insulating housing and the second insulating housing each include a reflective surface facing the heated cavity.

11. The thermal processor of claim 1 further comprising a vacuum pump for maintaining a pressure of less than about 100 Torr in the processing chamber during the thermal processing of the semiconductor substrate.

12. The thermal processor of claim 1, wherein the reflective material comprises a refractory metal.

13. The thermal processor of claim 1 wherein the first insulating housing forms a first opening for laterally inserting the semiconductor substrate into the heated cavity for processing.

14. The thermal processor of claim 13 wherein the chamber wall forms a second opening substantially aligned with the first opening such that the semiconductor substrate is laterally inserted through the first and second openings along substantially the same plane.

15. A thermal processor for processing a semiconductor substrate comprising: a processing chamber having a chamber wall;

a heat source providing at least one heated surface in the processing chamber adjacent to which the semiconductor substrate is placed for thermal processing, wherein the heated surface has a low emissivity; and a first insulating housing that is substantially non-transmissive to thermal radiation from the heated surface, the first insulating housing forming an insulated heated cavity substantially enclosing the semiconductor substrate such that direct radiation from the heated surface and the semiconductor substrate to the chamber wall is substantially avoided during the thermal processing.

16. The thermal processor of claim 15 wherein the heated surface has an emissivity of less about 0.3.

17. The thermal processor of claim 15 wherein the heated surface has an emissivity of about 0.1.

18. The thermal processor of claim 15 wherein the front side of the heated surface is reflective.

19. The thermal processor of claim 18 wherein the backside of the heated surface is substantially non-reflective.

20. The thermal processor of claim 15 wherein the heated surface comprises a reflective material and an inert material, wherein the inert material is positioned between the reflective material and the semiconductor substrate to isolate the reflective material from contaminating the semiconductor substrate and the reflective material forms a reflective surface facing the semiconductor substrate during thermal processing.

21. The thermal processor of claim 20 wherein the inert material comprises quartz.

22. The thermal processor of claim 20 wherein the inert material seals the reflective material in an enclosed space with an inert gas.

23. The thermal processor of claim 22 wherein the inert gas comprises helium.

24. The thermal processor of claim 15 wherein the backside of the heated surface has a high emissivity.

25. The thermal processor of claim 15 further comprising an elevational mechanism for moving the semiconductor substrate toward and away from the heated surface to control thermal processing.

26. The thermal processor of claim 15 further comprising a gas inlet for providing gas between the heated surface and the semiconductor substrate to promote conductive heat transfer from the heated surface to the semiconductor substrate.

27. The thermal processor of claim 15 further comprising a vacuum pump for maintaining a pressure of less than about 100 Torr in the processing chamber during the thermal processing of the semiconductor substrate.

* * * * *